(12) United States Patent
Hu et al.

(10) Patent No.: US 12,323,687 B2
(45) Date of Patent: Jun. 3, 2025

(54) DRIVING MECHANISM

(71) Applicant: TDK CORPORATION, Tokyo (JP)

(72) Inventors: Hsiao-Hsin Hu, Taoyuan (TW);
Shu-Shan Chen, Taoyuan (TW);
Chao-Chang Hu, Taoyuan (TW);
Pai-Jui Cheng, Taoyuan (TW);
Chieh-An Chang, Taoyuan (TW)

(73) Assignee: TDK Corporation, Tokyo (JP)

( * ) Notice: Subject to any disclaimer, the term of this patent is extended or adjusted under 35 U.S.C. 154(b) by 876 days.

(21) Appl. No.: 17/514,353

(22) Filed: Oct. 29, 2021

(65) Prior Publication Data

US 2022/0399486 A1 Dec. 15, 2022

Related U.S. Application Data

(60) Provisional application No. 63/209,750, filed on Jun. 11, 2021.

(51) Int. Cl.
| | |
|---|---|
| *H01L 41/09* | (2006.01) |
| *G01D 5/20* | (2006.01) |
| *G02B 7/02* | (2021.01) |
| *G02B 7/18* | (2021.01) |
| *G03B 13/34* | (2021.01) |
| *H01F 7/08* | (2006.01) |
| *H01F 27/28* | (2006.01) |
| *H02K 41/02* | (2006.01) |
| *H04N 23/54* | (2023.01) |

(Continued)

(52) U.S. Cl.
CPC ........... *H04N 23/54* (2023.01); *G01D 5/2046* (2013.01); *G02B 7/022* (2013.01); *G02B 7/023* (2013.01); *G02B 7/1805* (2013.01); *G03B 13/34* (2013.01); *H01F 7/081* (2013.01); *H01F 27/28* (2013.01); *H02K 41/02* (2013.01); *H04N 23/55* (2023.01); *H04N 23/57* (2023.01); *H10N 30/202* (2023.02); *H10N 30/88* (2023.02); *G02B 7/04* (2013.01); *H01F 2007/086* (2013.01)

(58) Field of Classification Search
CPC ..................................................... H10N 30/88
See application file for complete search history.

(56) References Cited

U.S. PATENT DOCUMENTS

2015/0103423 A1* 4/2015 Tanaka ................... G02B 7/08
74/89
2018/0071702 A1* 3/2018 Hidaka ............... C23C 16/4485
(Continued)

FOREIGN PATENT DOCUMENTS

CN 215181144 U 12/2021

OTHER PUBLICATIONS

Office Action mailed Feb. 14, 2022 in CN Application No. 202122635789.6, 2 pages.

*Primary Examiner* — Bryan P Gordon
(74) *Attorney, Agent, or Firm* — Muncy, Geissler, Olds & Lowe, P.C.

(57) ABSTRACT

A driving mechanism is provided, including a base, a movable module, and a driving assembly. The movable module has a movable member and a connecting member connected to the movable member. The driving assembly is connected to the base and the connecting member. The driving assembly has a driving element that generates a driving force to the connecting member and the movable member, so that the movable module moves relative to the base.

19 Claims, 10 Drawing Sheets

(51) Int. Cl.
*H04N 23/55* (2023.01)
*H04N 23/57* (2023.01)
*H10N 30/20* (2023.01)
*H10N 30/88* (2023.01)
*G02B 7/04* (2021.01)

(56) References Cited

U.S. PATENT DOCUMENTS

2018/0284386 A1* 10/2018 Huang .................... G03B 3/10
2021/0138790 A1* 5/2021 Nakamura ........... B41J 2/17596

* cited by examiner

DRIVING MECHANISM

CROSS REFERENCE TO RELATED APPLICATIONS

This Application claims priority of provisional U.S. Patent Application Ser. No. 63/209,750, filed on Jun. 11, 2021, the entirety of which is incorporated by reference herein.

BACKGROUND OF THE INVENTION

Field of the Invention

The application relates in general to a driving mechanism, and in particular, to a driving mechanism used to move an optical element.

Description of the Related Art

As technology has advanced, a lot of electronic devices (for example, laptop computers and smartphones) have incorporated the functionality of taking photographs and recording video. These electronic devices have become more commonplace, and have been developed to be more convenient and thin. More and more options are provided for users to choose from.

In some electronic devices, several coils and magnets are usually used for adjusting the focus of a lens. However, miniaturization of the electronic devices may increase the difficulty of mechanical design, and it may also lead to low reliability and a low driving force for moving the lens. Therefore, addressing the aforementioned problems has become a challenge.

BRIEF SUMMARY OF INVENTION

In view of the aforementioned problems, the object of the invention is to provide a driving mechanism that includes a base, a movable module, and a driving assembly. The movable module has a movable member and a connecting member connected to the movable member. The driving assembly is connected to the base and the connecting member. The driving assembly has a driving element that generates a driving force to the connecting member and the movable member, so that the movable module moves relative to the base.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the driving mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
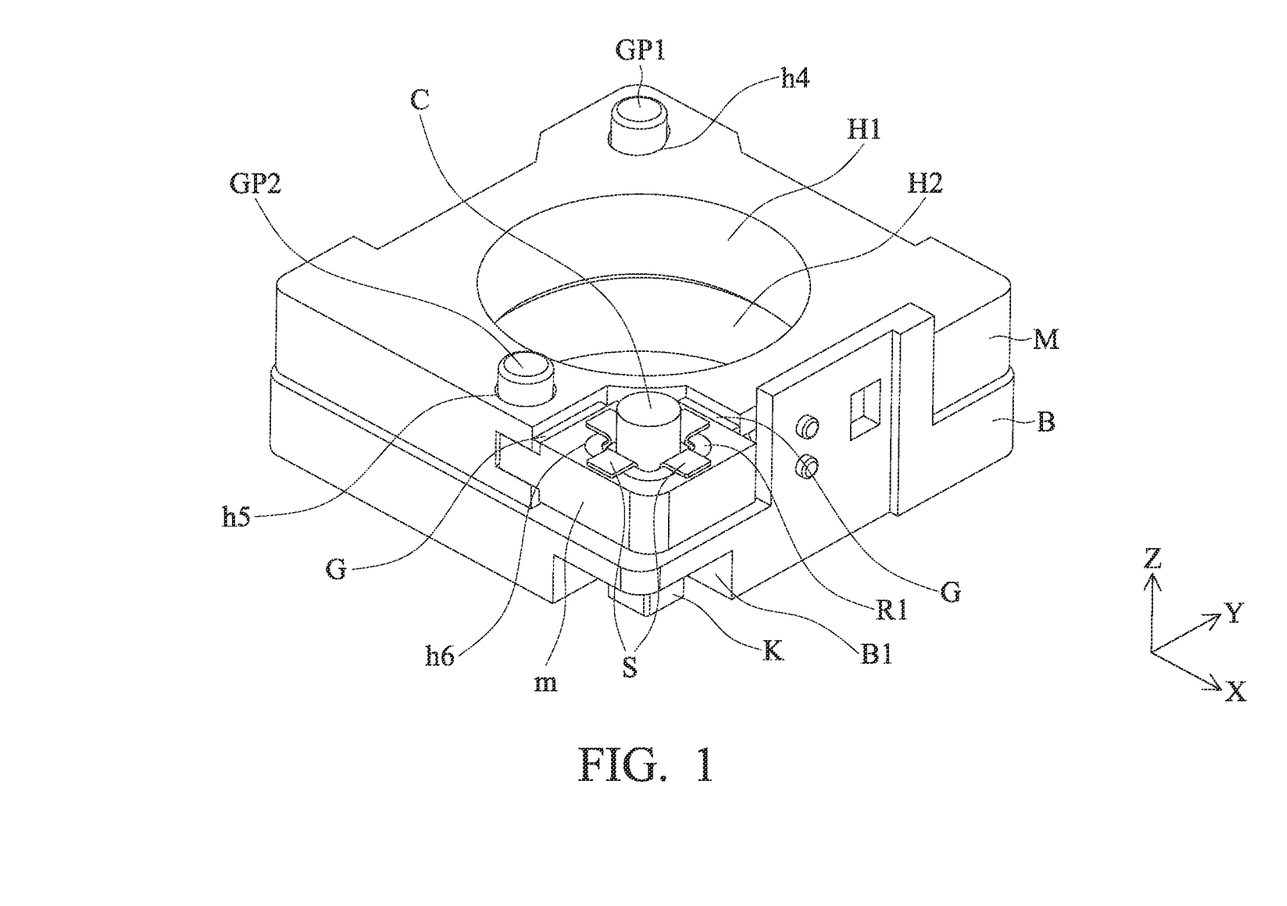
FIG. 1 is a perspective diagram of a driving mechanism in accordance with an embodiment of the invention.
Figure 2:
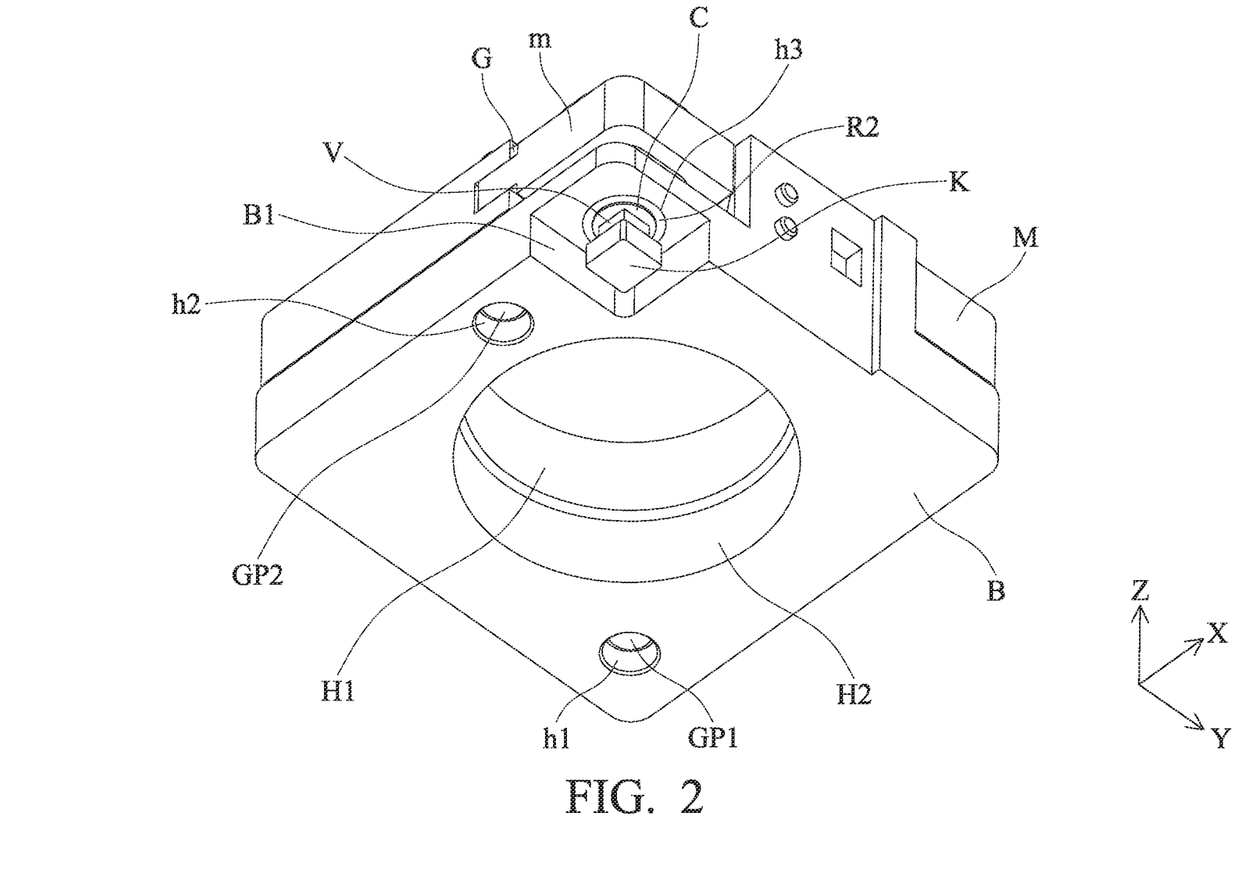
FIG. 2 is another perspective diagram of the optical mechanism in FIG. 1.
Figure 3:
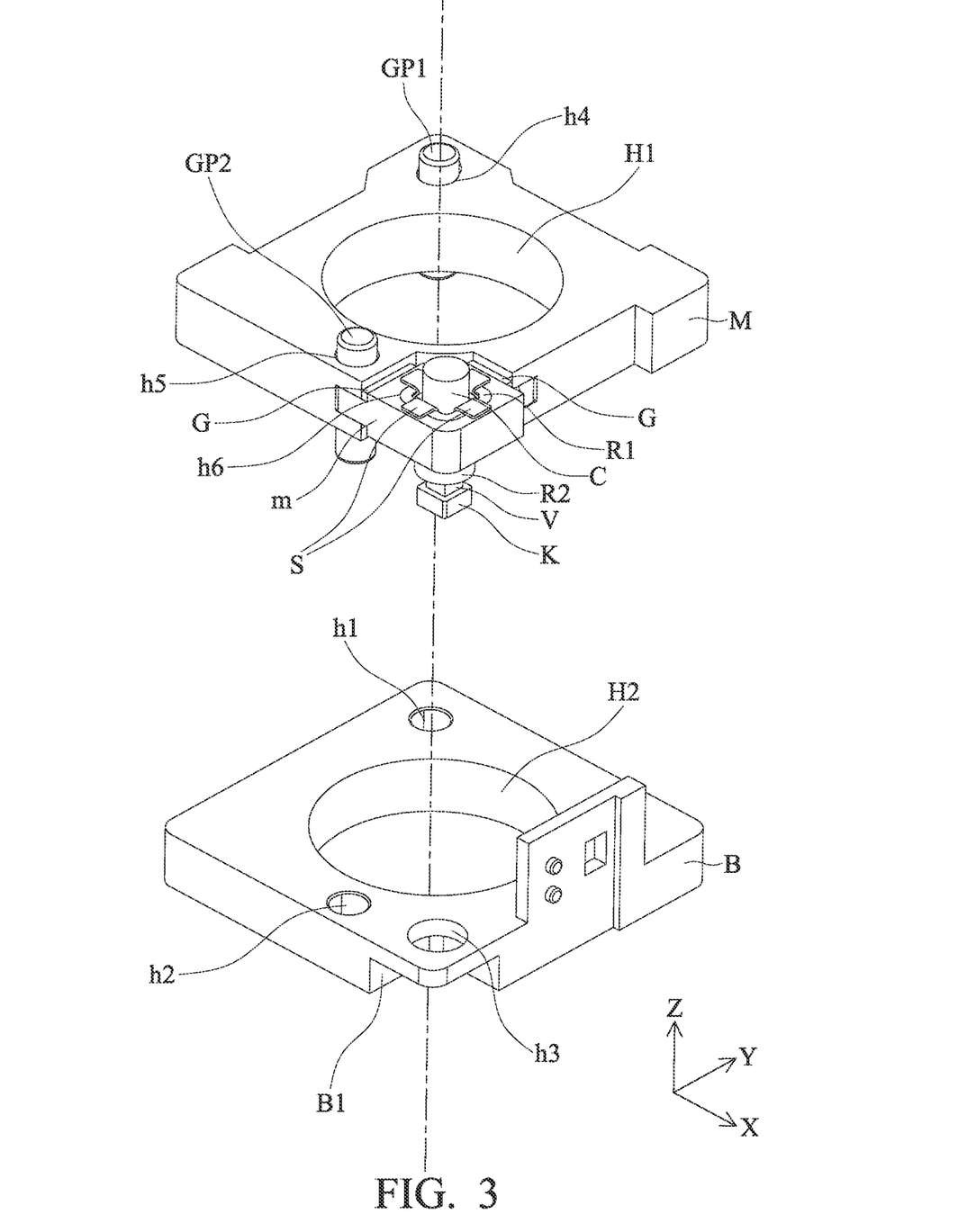
FIG. 3 is an exploded diagram of the optical mechanism in FIGS. 1 and 2.
Figure 4:
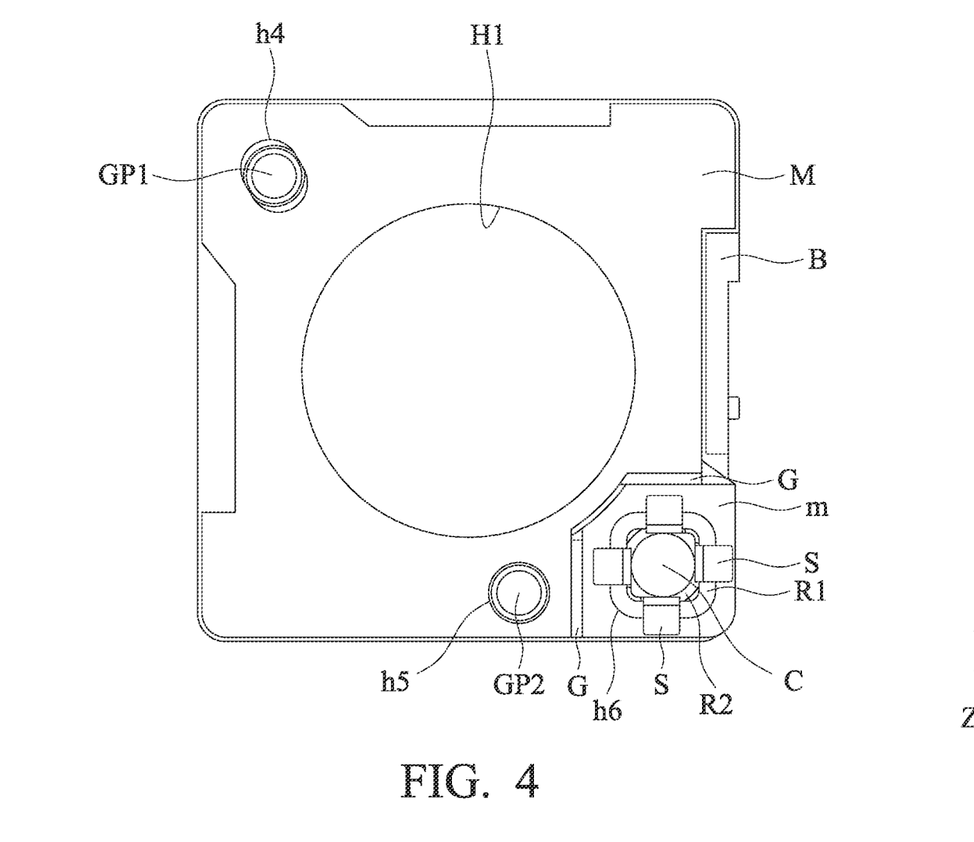
FIG. 4 is a top view of the optical mechanism in FIGS. 1 and 2.
Figure 5:
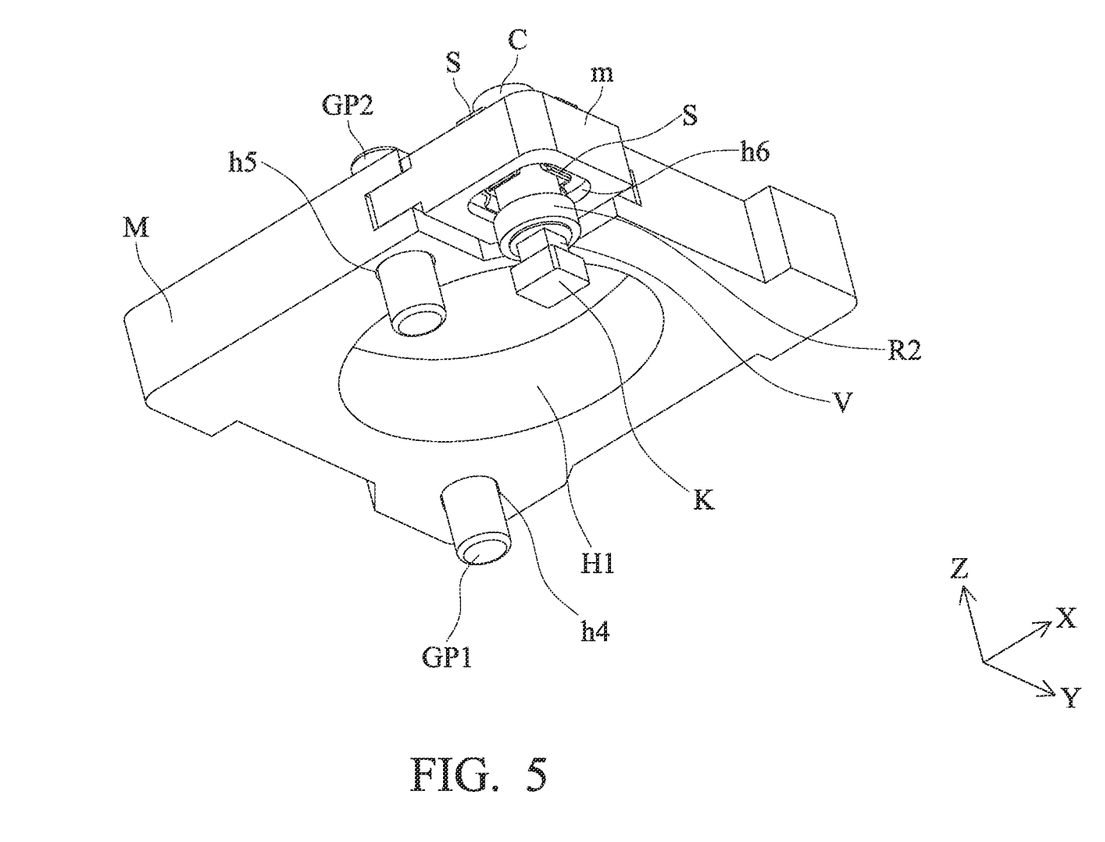
FIG. 5 is a perspective diagram of the optical mechanism in FIGS. 1 and 2 with the base B omitted therefrom.

FIG. 1 is a perspective diagram of a driving mechanism in accordance with an embodiment of the invention. FIG. 2 is another perspective diagram of the optical mechanism in FIG. 1. FIG. 3 is an exploded diagram of the optical mechanism in FIGS. 1 and 2. FIG. 4 is a top view of the optical mechanism in FIGS. 1 and 2. FIG. 5 is a perspective diagram of the optical mechanism in FIGS. 1 and 2 with the base B omitted therefrom.

Referring to FIGS. 1-5, the driving mechanism in this embodiment primarily includes a base B, a movable member M, a connecting member m, a first guiding pin GP1, a second guiding pin GP2, a transmission rod C, two frictional elements S, a resilient member R1, a buffer member R2, a driving element V (e.g. piezoelectric element), and a weight block K. The movable member M and the connecting member m adhere to each other via the glue G, and they constitute a movable module of the driving mechanism. The first and second guiding pins GP1 and GP2 are disposed through the movable member M and connected to the base B.

In this embodiment, the base B has a first hole h1, a second hole h2, and a third hole h3. The movable member M has a fourth hole h4 and a fifth hole h5, and the connecting member m has a through hole h6. The first guiding pin GP1 is firmly joined to the first hole h1 of the base B and extends through the fourth hole h4 of the movable member M. The second guiding pin GP2 is firmly joined to the second hole h2 of the base B and extends through the fifth hole h5 of the movable member M.

Here, the first guiding pin GP1 and the second guiding pin GP2 are respectively joined to the first hole h1 and the second hole h2 in an interference-fit manner. Additionally, the first guiding pin GP1 is joined to the fourth hole h4 in a clearance-fit manner, and the second guiding pin GP2 is joined to the fifth hole h5 in a transition-fit manner. When the movable module (including the movable member M and the connecting member m) is impelled by a driving force, the movable module can slide relative to the base B in the Z or −Z direction along the first guiding pin GP1 and the second guiding pin GP2, wherein the first and second guiding pins GP1 and GP2 are immovable relative to the base B.

The resilient member R1 and the buffer member R2 may comprise rubber. The resilient member R1 is disposed in the through hole h6 of the connecting member m, and the transmission rod C may be a carbon fiber rod that extends through the resilient member R1. The frictional elements S may comprise metal spring sheets that are clamped between the transmission rod C and the resilient member R1. The buffer member R2 is disposed in the third hole h3 of the base B and connects the transmission rod C to the base B. The driving element V is disposed at the bottom of the transmission rod C and connected to the weight block K, wherein the driving element V and the weight block K are located in a recess B1 of the base B.

Still referring to FIGS. 1-5, the movable member M has a first opening H1, and the base B has a second opening H2 communicated with the first opening H1. An optical element (e.g. optical lens) may be disposed in the first opening H1, and when an external circuit applies an electrical signal to the driving element V (e.g. piezoelectric element), the driving element V generates a driving force (e.g. vibration signal) through the transmission rod C to the connecting member m and the movable member M. Thus, the movable module including the movable member M and the connecting member m can be driven to move relative to the base B in the Z or −Z direction that is substantially parallel to the optical axis of the optical element.

In this embodiment, the transmission rod C is connected with the frictional elements S in a transition-fit manner, and the transmission rod C is joined to the buffer member R2 in a transition-fit manner. Here, the friction (gripping force) between the transmission rod C and the buffer member R2 is greater than the friction (gripping force) between the transmission rod C and the frictional elements S. When the driving element V generates a driving force (e.g. vibration signal) through the transmission rod C to the frictional elements S, the frictional elements S can slide relative to the transmission rod C, but the transmission rod C is immovable relative to the buffer member R2.

The fourth hole h4 is formed at a corner of the movable member M, the fifth hole h5 is located near the connecting member m, and the first opening H1 is formed between the fourth hole h4 and the connecting member m. Specifically, the fourth hole h4 has a longitudinal structure that defines a long axis substantially parallel to an radius of the first opening H1. Hence, easy assembly of the driving mechanism can be achieved, and mechanical interference between the connecting member m and the transmission rod C during operation of the driving mechanism can also be prevented. Additionally, rotation of the movable member M relative to the base B can be avoided, thereby improving the stability of the driving mechanism.

Figure 6:
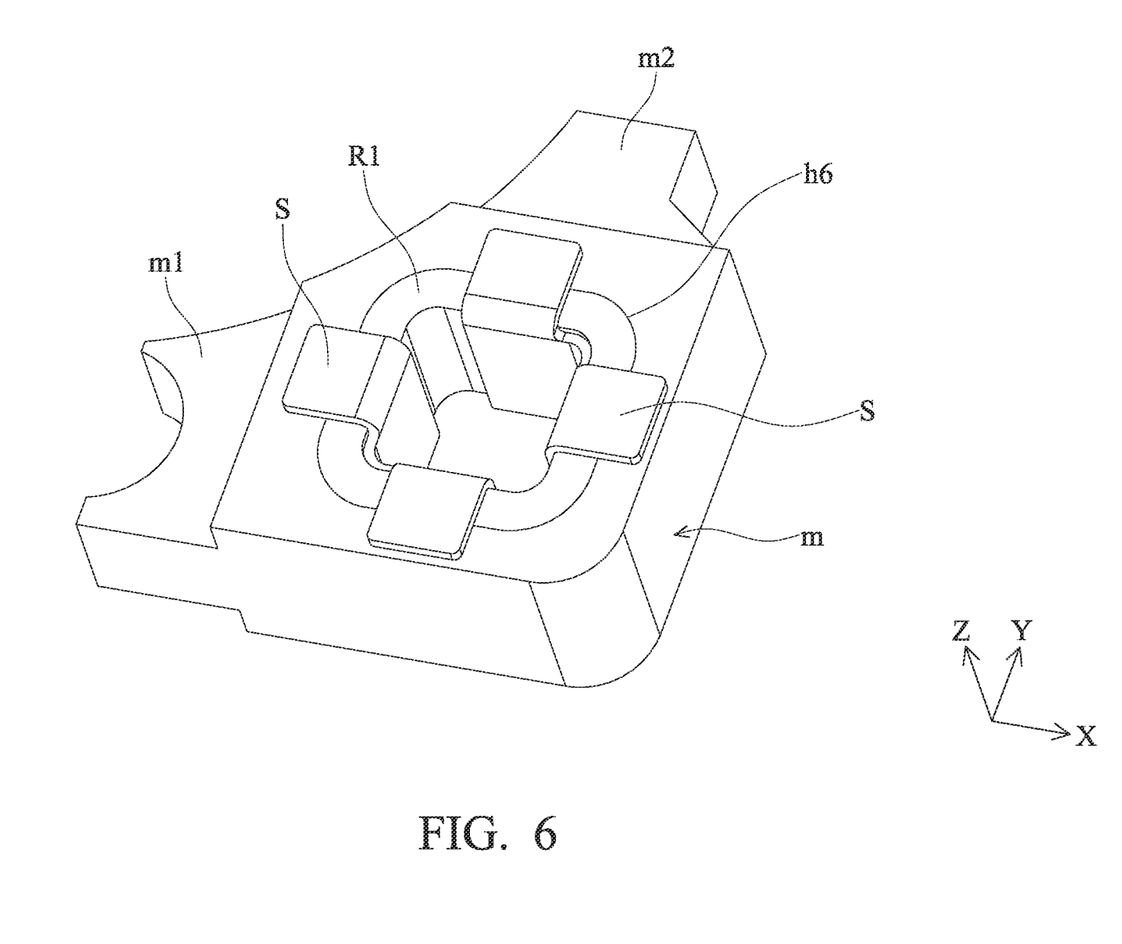
FIG. 6 is a perspective diagram of the frictional elements S and the resilient member R1 disposed in the through hole h6 of the connecting member m.
Figure 7:
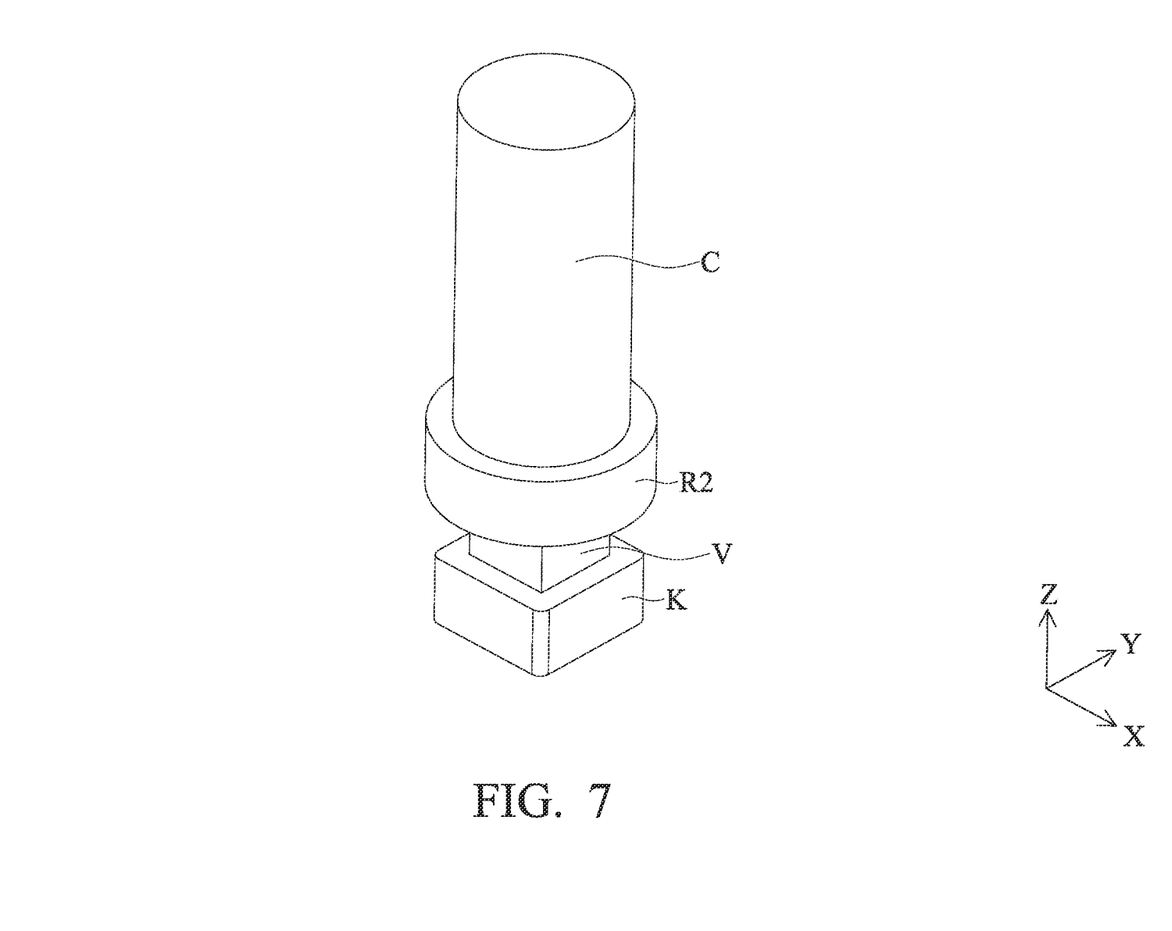
FIG. 7 is a perspective diagram of the buffer member R2, the transmission rod C, the driving element V, and the weight block K after assembly.
Figure 8:
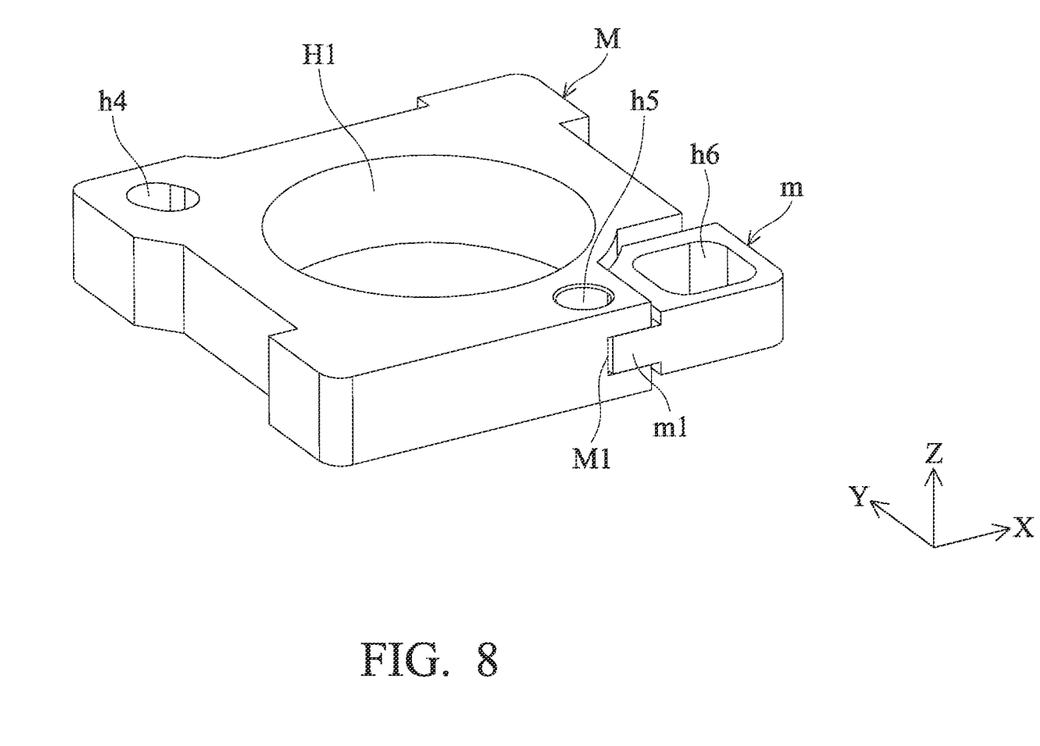
FIG. 8 is a perspective diagram of the connecting member m and the movable member M joined together.

FIG. 6 is a perspective diagram of the frictional elements S and the resilient member R1 disposed in the through hole h6 of the connecting member m. FIG. 7 is a perspective diagram of the buffer member R2, the transmission rod C, the driving element V, and the weight block K after assembly. FIG. 8 is a perspective diagram of the connecting member m and the movable member M joined together. FIG. 8 is another perspective diagram of the connecting member m and the movable member M joined together.

As shown in FIG. 6, the through hole h6 of the connecting member m and the resilient member R1 in the through hole h6 have a substantially rectangular structure. The two frictional elements S are disposed in the hollow resilient member R1 and are located on opposite sides of the transmission rod C, so that the transmission rod C is clamped between the two frictional elements S. When the driving element V generates a driving force (e.g. vibration signal) through the transmission rod C to the frictional elements S, the frictional elements S can slide to a target position along the transmission rod C. Hence, the movable module (including the connecting member m and the movable member M) and the optical element disposed thereon can be driven to move relative to the base B in the Z or −Z direction, thereby achieving the function of Auto-Focusing (AF) or Optical Image Stabilization (OIS).

Referring to FIG. 7, the transmission rod C has a cylindrical structure, and the buffer member R2 has an annular structure surrounding the transmission rod C. Thus, the transmission rod C and the driving element V below the transmission rod C can be protected by the buffer member R2. Here, the buffer member R2, the transmission rod C, the driving element V, and the weight block K constitute a driving assembly for driving the movable module (including the connecting member m and the movable member M) to move relative to the base B. The weight block K may comprise metal material to improve the stability of the driving mechanism during usage.

Figure 9:
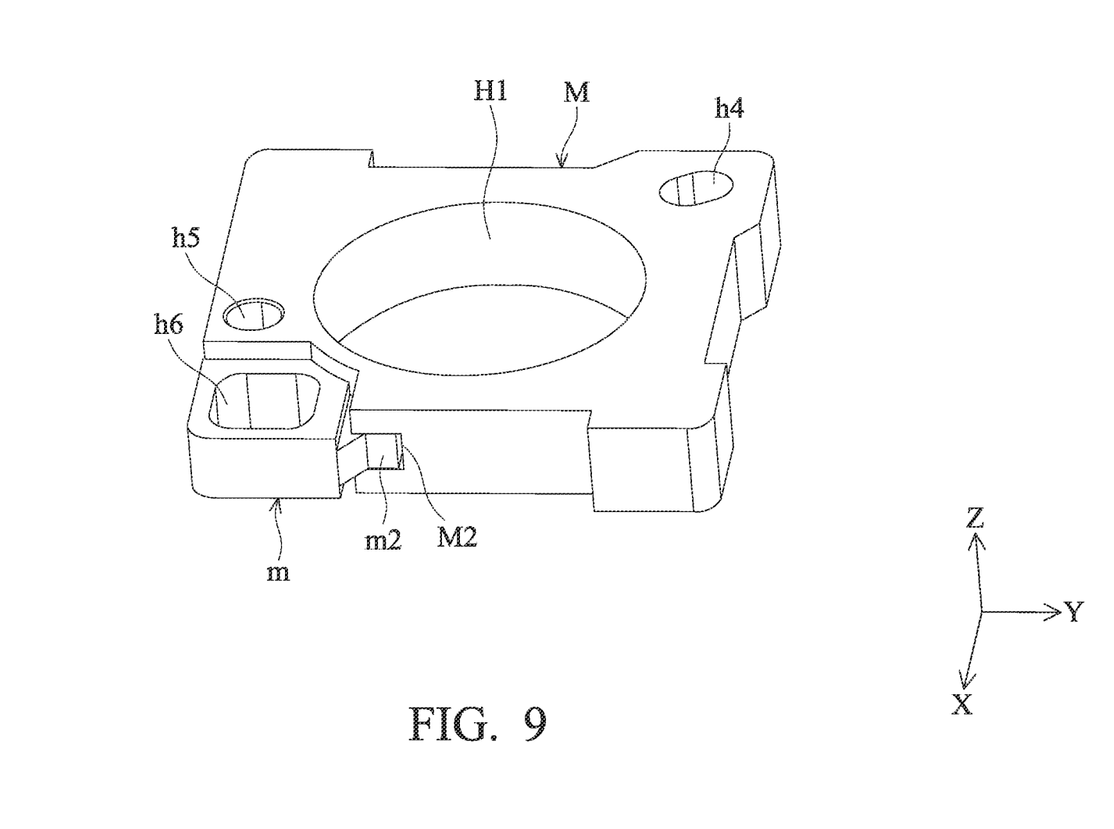
FIG. 9 is another perspective diagram of the connecting member m and the movable member M joined together.

In FIGS. 6, 8, and 9, the connecting member m is arranged at a corner of the movable member M, and it has two protrusions m1 and m2 respectively protruding toward the −X and Y directions. Additionally, the movable member M has two cavities M1 and M2 for receiving the protrusions m1 and m2. During assembly of the driving mechanism, the protrusions m1 and m2 are joined in the cavities M1 and M2, so that the connecting member m and the movable member M are connected to each other.

In some embodiments, the connecting member m and the movable member M may be joined to each other without the glue G. Therefore, the connecting member m and the movable member M can have a clearance therebetween to facilitate easy disassembly and reassembly, and the driving element V can also be prevented from fall damage due to the impact wave.

Figure 10:
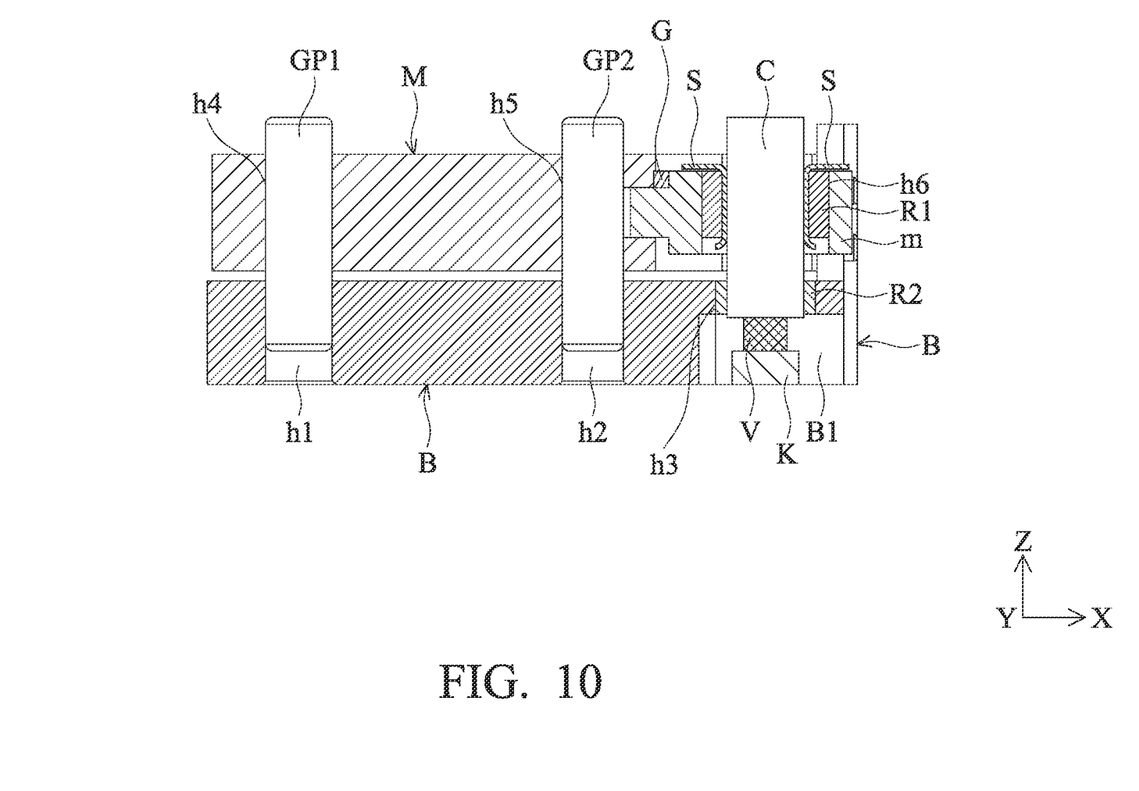
FIG. 10 is a cross-sectional view of the driving mechanism in FIGS. 1 and 2.

FIG. 10 is a cross-sectional view of the driving mechanism in FIGS. 1 and 2. As mentioned above, the first guiding pin GP1 and the second guiding pin GP2 are firmly joined to the first hole h1 and the second hole h2 in an interference-fit manner. That is, the first and second guiding pins GP1 and GP2 are immovable relative to the base B.

Specifically, each of the frictional elements S has a C-shaped cross-section, wherein the transmission rod C is connected with the frictional elements S in a transition-fit manner, and the transmission rod C is joined to the buffer member R2 in a transition-fit manner. It should be noted that the friction (gripping force) between the transmission rod C and the buffer member R2 is greater than the friction (gripping force) between the transmission rod C and the frictional elements S.

Moreover, the first guiding pin GP1 is joined to the fourth hole h4 in a clearance-fit manner, and the second guiding pin GP2 is joined to the fifth hole h5 in a transition-fit manner. It should be noted that the friction (gripping force) between the first guiding pin GP1 and the fourth hole h4 is less than the friction (gripping force) between the second guiding pin GP2 and the fifth hole h5, and the friction (gripping force) between the second guiding pin GP2 and the fifth hole h5 is less than the friction (gripping force) between the transmission rod C and the frictional elements S, thereby facilitating smooth and precise sliding of the movable module (including the connecting member m and the movable member M) relative to the base B along the Z axis.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A driving mechanism, comprising:
a base;
a movable module, having a movable member and a connecting member connected to the movable member; and
a driving assembly, connected to the base and the connecting member, wherein the driving assembly has a driving element that generates a driving force to the connecting member and the movable member, so that the movable module moves relative to the base,
wherein the driving assembly further has a hollow resilient member disposed on the connecting member, a frictional element disposed in the resilient member, and a transmission rod connected to the base and the frictional element, wherein the driving element is disposed on the transmission rod and generates the driving force to the connecting member and the movable member via the transmission rod.

2. The driving mechanism as claimed in claim 1, further comprising a first guiding pin and a second guiding pin, wherein the base has a first hole, a second hole, and a third hole, the first and second guiding pins are respectively joined in the first and second holes, and the transmission rod extends through the third hole.

3. The driving mechanism as claimed in claim 2, wherein the first guiding pin is joined to the first hole in an interference-fit manner.

4. The driving mechanism as claimed in claim 3, wherein the second guiding pin is joined to the second hole in an interference-fit manner.

5. The driving mechanism as claimed in claim 2, wherein the movable member has a fourth hole and a fifth hole, the first and second guiding pins are movably received in the fourth and fifth holes.

6. The driving mechanism as claimed in claim 5, wherein the fourth hole has a longitudinal structure.

7. The driving mechanism as claimed in claim 6, wherein the first guiding pin is joined to the fourth hole in a clearance-fit manner.

8. The driving mechanism as claimed in claim 7, wherein the second guiding pin is joined to the fifth hole in a transition-fit manner.

9. The driving mechanism as claimed in claim 2, wherein the connecting member has a through hole, the frictional element is disposed in the through hole, and the transmission rod is connected with the frictional element in a transition-fit manner.

10. The driving mechanism as claimed in claim 9, wherein the driving assembly further has a buffer member disposed in the third hole, and the transmission rod extends through the buffer member.

11. The driving mechanism as claimed in claim 10, wherein the transmission rod is joined to the buffer member in a transition-fit manner.

12. The driving mechanism as claimed in claim 11, wherein friction between the transmission rod and the buffer member is greater than friction between the transmission rod and the frictional element.

13. The driving mechanism as claimed in claim 9, wherein the movable member has a fourth hole and a fifth hole, and the first and second guiding pins are movably received in the fourth and fifth holes.

14. The driving mechanism as claimed in claim 13, wherein the second guiding pin is joined to the fifth hole in a transition-fit manner, and friction between the second guiding pin and the fifth hole is less than friction between the transmission rod and the frictional element.

15. The driving mechanism as claimed in claim 1, wherein the frictional element has a C-shaped cross-section.

16. The driving mechanism as claimed in claim 1, wherein the driving element comprises a piezoelectric element that generates a vibration signal to transfer the driving force through the transmission rod to the connecting member and the movable member.

17. The driving mechanism as claimed in claim 16, further comprising a weight block connected to the driving element, wherein the weight block and the transmission rod are located on opposite sides of the driving element.

18. The driving mechanism as claimed in claim 1, wherein the movable member has a cavity, and the connecting member has a protrusion joined in the cavity.

19. The driving mechanism as claimed in claim 1, wherein the movable member and the connecting member adhere to each other.

* * * * *